(12) United States Patent
Li et al.

(10) Patent No.: US 10,872,910 B2
(45) Date of Patent: Dec. 22, 2020

(54) DISPLAY SUBSTRATE MOTHERBOARD, DISPLAY SUBSTRATE AND FABRICATION METHOD THEREOF, AND DISPLAY DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Yansheng Li, Beijing (CN); Yingdan Zhang, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/391,894

(22) Filed: Apr. 23, 2019

(65) Prior Publication Data

US 2020/0075639 A1    Mar. 5, 2020

(30) Foreign Application Priority Data

Aug. 30, 2018    (CN) .......................... 2018 1 1004709

(51) Int. Cl.
*H01L 27/12* (2006.01)
*H01L 21/78* (2006.01)
*H01L 21/66* (2006.01)
*G01R 31/26* (2020.01)

(52) U.S. Cl.
CPC ...... *H01L 27/1244* (2013.01); *G01R 31/2644* (2013.01); *H01L 21/78* (2013.01); *H01L 22/32* (2013.01); *H01L 27/1259* (2013.01)

(58) Field of Classification Search
None
See application file for complete search history.

(56) References Cited

U.S. PATENT DOCUMENTS

| 2009/0294771 | A1 | 12/2009 | Kim et al. | |
| 2010/0006838 | A1* | 1/2010 | Yoshida | G09G 3/006 257/48 |
| 2016/0035744 | A1 | 2/2016 | Kim et al. | |
| 2016/0359137 | A1* | 12/2016 | Chen | H01L 21/77 |

FOREIGN PATENT DOCUMENTS

CN    103713410 A    4/2014

OTHER PUBLICATIONS

The First Chinese Office Action dated Oct. 10, 2020; Appln. No. 201811004709.3.

* cited by examiner

*Primary Examiner* — Herve-Louis Y Assouman

(57) ABSTRACT

At least one embodiment of the present disclosure provides a display substrate motherboard, a display substrate, a fabrication method thereof and a display device. The display substrate motherboard includes at least one display substrate unit, the display substrate unit includes a display region, a bonding region and a detection region, the bonding region is located on a side of the display region and the detection region is located on a side of the display region different from the bonding region and configured to detect the display substrate unit.

18 Claims, 5 Drawing Sheets

DISPLAY SUBSTRATE MOTHERBOARD, DISPLAY SUBSTRATE AND FABRICATION METHOD THEREOF, AND DISPLAY DEVICE

TECHNICAL FIELD

At least one embodiment of the present disclosure provides a display substrate motherboard, a display substrate, a fabrication method thereof and a display device.

BACKGROUND

With development and advancement of society, electronic display products have been more and more widely applied, and users pose higher and higher requirement on quality of the electronic display products. An electronic display product comprises a display substrate; and in a fabrication process of the display substrate, it is necessary to provide a detecting circuit in a display substrate motherboard to detect a circuit structure in the display substrate motherboard, so as to ensure a yield of the display substrate obtained by cutting the display substrate motherboard.

However, with respect to a display substrate motherboard of a current structure, after a detecting circuit is cut off in a cutting process, a circuit structure in a display substrate may be short-circuited, thus adversely affecting a yield of the display substrate.

SUMMARY

At least one embodiment of the present disclosure provides a display substrate motherboard, the display substrate motherboard comprises at least one display substrate unit, the display substrate unit includes: a display region; a bonding region, located on a side of the display region; and a detection region, located on a side of the display region different from the bonding region, and configured to detect the display substrate unit.

For example, in the display substrate motherboard provided by at least one embodiment of the present disclosure, the display substrate unit includes a display function region, the display function region includes a display region and a bonding region, the detection region is located on a side of the display function region, and the display function region includes a signal line, a first end of the signal line extends to the bonding region, and a second end of the signal line that is opposite to the first end extends to the detection region.

For example, in the display substrate motherboard provided by at least one embodiment of the present disclosure, the display substrate motherboard further comprises: a detection contact pad, provided in the detection region and configured to be electrically connected with a detecting device during detection, and the second end is electrically connected with the detection contact pad.

For example, in the display substrate motherboard provided by at least one embodiment of the present disclosure, the display substrate motherboard further comprises: a switching element, located in the detection region, and the signal line is connected with the switching element in one-to-one correspondence, the second end of the signal line is electrically connected with a first end of the switching element, and a second end of the switching element is electrically connected with the detection contact pad.

For example, in the display substrate motherboard provided by at least one embodiment of the present disclosure, the display substrate motherboard further comprises: a detection control line, located in the detection region, the detection control line is electrically connected with a control end of the switching element, and is configured to provide a control signal that controls turn-on or turn-off of the switching element.

For example, in the display substrate motherboard provided by at least one embodiment of the present disclosure, a number of detection control lines is set to one, and control ends of all the switching elements are electrically connected with the detection control line; or the number of detection control lines is set to be plural, the switching elements are divided into a plurality of groups, the plurality of groups are in one-to-one correspondence with the detection control lines, and a control end of each group of the switching elements is electrically connected with a corresponding one of the detection control lines.

For example, in the display substrate motherboard provided by at least one embodiment of the present disclosure, the switching element is a thin film transistor, and the detection control line is electrically connected with a gate electrode of the thin film transistor.

For example, in the display substrate motherboard provided by at least one embodiment of the present disclosure, the display substrate unit further includes a preset cutting line, the switching element is located between the preset cutting line and the display region, and the detection contact pad is located on a side of the preset cutting line that is opposite to the display region.

For example, in the display substrate motherboard provided by at least one embodiment of the present disclosure, the detection region is located on a side of the display region that is opposite to the bonding region.

For example, in the display substrate motherboard provided by at least one embodiment of the present disclosure, the detection contact pad is electrically connected with second ends of at least two of the switching elements.

At least one embodiment of the present disclosure provides a display substrate, the display substrate comprises: a display region; a bonding region, located on a side of the display region; and a detection region, located on a side of the display region different from the bonding region, and configured to detect the display substrate unit.

For example, in the display substrate provided by at least one embodiment of the present disclosure, the display substrate comprises a display function region, the display function region includes the display region and the bonding region, the detection region is located on a side of the display function region, and the display function region includes a signal line, a first end of the signal line extends to the bonding region, and a second end of the signal line that is opposite to the first end extends to the detection region.

For example, in the display substrate provided by at least one embodiment of the present disclosure, the display substrate comprises a switching element provided in the detection region, and the second end of the signal line that is opposite to the first end is electrically connected with a first end of the switching element, and a second end of the switching element extends to a cutting edge of the display substrate that is located on a side of the detection region.

For example, in the display substrate provided by at least one embodiment of the present disclosure, the detection region is located on a side of the display region that is opposite to the bonding region.

For example, in the display substrate provided by at least one embodiment of the present disclosure, the second end of the switching element is aligned with the cutting edge of the display substrate that is located on a side of the detection region.

At least one embodiment of the present disclosure provides a display device, which comprises the display substrate as mentioned above.

At least one embodiment of the present disclosure provides a fabrication method of a display substrate, the method comprises: providing a base substrate, the base substrate including a plurality of display substrate unit regions, the display substrate unit region including a detection region, a display region and a bonding region, the bonding region being located on a side of the display region different from the detection region; and cutting the base substrate along a preset cutting line passing through the detection region, to obtain the display substrate.

For example, in the fabrication method of a display substrate provided by at least one embodiment of the present disclosure, the display substrate unit region includes a display function region, and the detection region is located on a side of the display function region.

For example, in the fabrication method of a display substrate provided by at least one embodiment of the present disclosure, the fabrication method further comprises: forming a detection contact pad in the detection region, and forming a signal line on the display function region, a first end of the signal line extending to the bonding region, and a second end of the signal line that is opposite to the first end being electrically connected with the detection contact pad; the cutting the base substrate along the preset cutting line passing through the detection region includes: cutting the base substrate along the preset cutting line passing through the detection region and located on a side of the detection contact pad close to the display function region.

For example, in the fabrication method of a display substrate provided by at least one embodiment of the present disclosure, the fabrication method further comprises forming a switching element in the detection region, the second end of the signal line is electrically connected with a first end of the switching element, a second end of the switching element is electrically connected with the detection contact pad, and the preset cutting line is located between the second end of the switching element and the detection contact pad.

For example, in the fabrication method of a display substrate provided by at least one embodiment of the present disclosure, the fabrication method further comprises forming a detection control line in the detection region, the detection control line is formed to be electrically connected with the switching element, and is configured to control turn-on and turn-off of the switching element.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

Figure 1A:
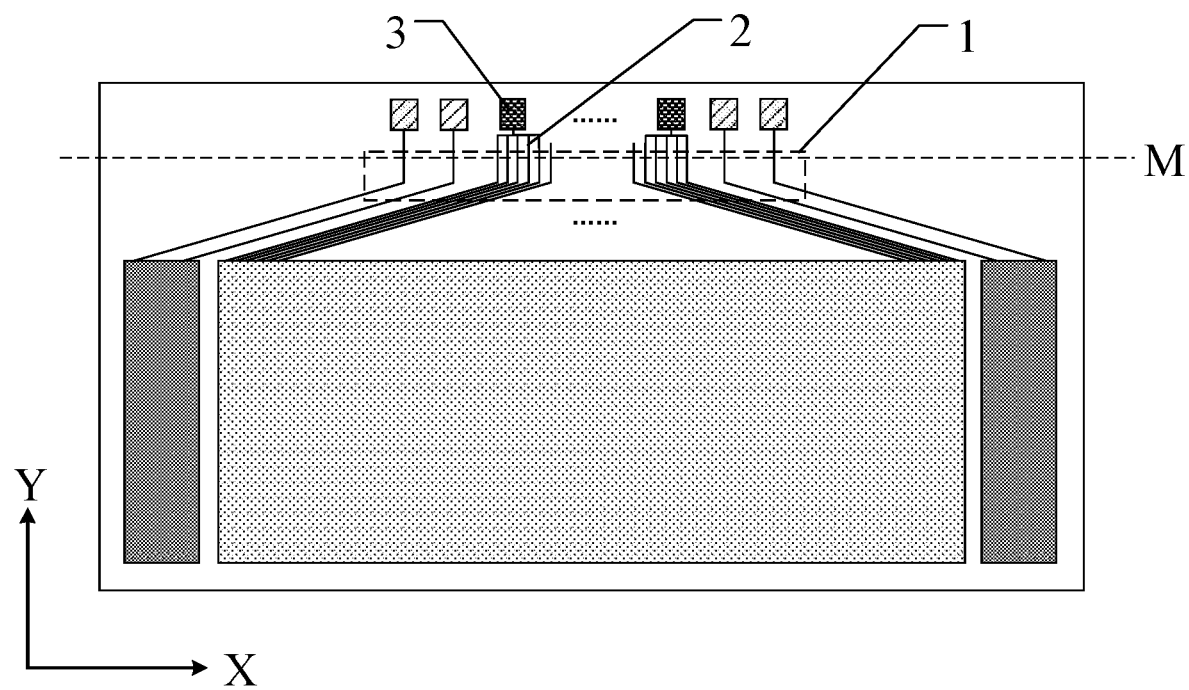
FIG. 1A is a planar structural schematic diagram of a display substrate motherboard.

10—display function region; 20—detection region; 100—base substrate; 110—display region; 120—non-display region; 121—bonding region; 200—signal line; 201—first end of signal line; 202—second end of signal line; 300—detection contact pad; 400—switching element; 410—first end of switching element; 420—second end of switching element; 430—gate electrode; 500—detection control line; 510—detection control contact pad; 600—gate drive circuit.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a production process of a display substrate, a display substrate motherboard may be fabricated firstly, and after the display substrate motherboard is cut, at least one display substrate, for example, a plurality of display substrates, may be obtained. A detecting circuit is provided in the display substrate motherboard, to detect a performance of a circuit structure in the display substrate, so as to ensure a yield of the produced display substrate. Besides, in a process of cutting the display substrate motherboard, the detecting circuit may be cut off without remaining in the display substrate as a product.

A bonding region is set in the display substrate, and signal lines in the display substrate converge to the bonding region, for establishing an electrical connection with an external control circuit structure (for example, a flexible circuit board, an integrated circuit chip, etc.) in a bonding mode. Thus, a separation distance between signal lines in the bonding region is smaller than a separation distance between signal lines in a display function region (or an active region) of the display substrate. In a case where the detecting circuit is connected with the signal lines in the bonding region to perform detection, in a process of cutting the detecting circuit, ends of the signal lines that are cut (for example, cut by a cutter wheel) are deformed by force, so that adjacent signal lines may be connected with each other and short-circuited, which adversely affects the yield of the display substrate. Moreover, in a detection process, an external detecting device applies an electrical signal for detection to the signal lines through a probe, but the signal lines usually have a relatively small width and are arranged densely, so a contact pad connected with the signal line is usually provided, and a size (e.g., a width) of the contact pad is larger than the width of the signal line, so that the contact pad may have better contact with the probe. However, the set number of contact pads and a design size thereof are limited by the bonding region, so that detection accuracy is also limited.

Figure 1B:
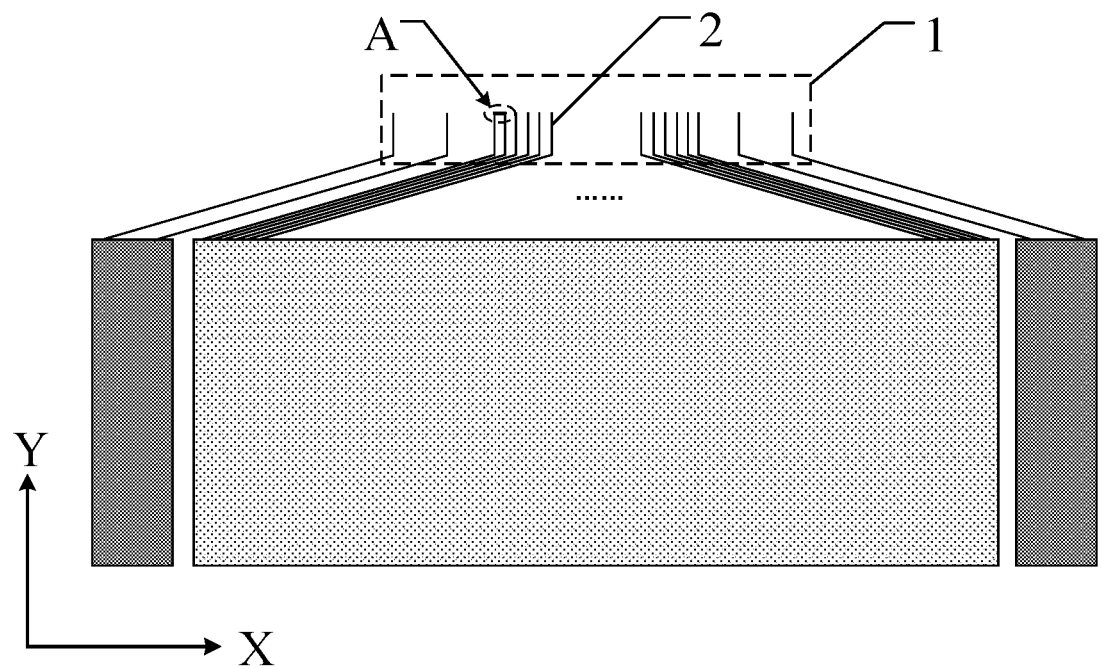
FIG. 1B is a planar structural schematic diagram of a display substrate obtained by cutting the display substrate motherboard shown in FIG. 1A along a cutting line P.

FIG. 1A is a planar structural schematic diagram of a display substrate motherboard, and FIG. 1B is a planar structural schematic diagram of a display substrate obtained by cutting the display substrate motherboard shown in FIG. 1A along a cutting line P.

Exemplarily, as shown in FIG. 1A and FIG. 1B, the display substrate motherboard comprises a bonding region 1, wherein, signal lines 2 to be detected converge to the bonding region 1. As shown in FIG. 1A, a detecting circuit, for example, a detection contact pad 3 is provided on one side of the bonding region 1, the detection contact pad 3 is electrically connected with the signal line 2, and the detection contact pad 3 is used for applying a detection signal to the signal line 2. After detection is completed, the detection contact pad 3 is cut off along a preset cutting line M, so as to obtain the display substrate as shown in FIG. 1B. For example, as shown in FIG. 1A, adjacent two signal lines 2 in an A region of the bonding region 1 are electrically connected with each other by cutting, that is, the adjacent signal lines 2 in the A region are short-circuited, and it is necessary to perform maintenance to eliminate the short circuit defect, thus reducing a fabrication yield of the display substrate.

At least one embodiment of the present disclosure provides a display substrate motherboard, comprising at least one display substrate unit, the display substrate unit including: a display region; a bonding region, located on one side of the display region; and a detection region, located on a side of the display region different from the bonding region, for example, an opposite side of the bonding region, and configured to detect the display substrate unit, wherein, the detection region and the bonding region are located on different sides of a display function region, and arrangement of signal lines electrically connected with the detection region is not limited by the bonding region, so that a separation distance between signal lines of the detection region is increased as compared with that in a case where the detection region and the bonding region are located on a same side of the display function region, thus rendering a larger separation distance between signal lines. In this way, after the display substrate is obtained by using a cutting process, a probability of a short circuit between adjacent signal lines is reduced at a cutting line, which significantly reduces a risk of a short circuit due to a connection between adjacent signal lines, so that a yield of the display substrate is improved, and fabrication costs of the display substrate are reduced.

For example, a display substrate motherboard provided by at least one embodiment of the present disclosure comprises at least one display substrate unit, the display substrate unit includes a display function region and a detection region located on one side of the display function region, the display function region includes a display region and a non-display region surrounding the display region, the non-display region includes a bonding region, the detection region is located on a side of the display region different from the bonding region, for example, an opposite side of the bonding region, and the detection region is provided therein with a detecting circuit, for example, a detection contact pad; the display function region includes a signal line, a first end of the signal line extends to the bonding region, and a second end of the signal line that is opposite to the first end is connected with the detection contact pad. For example, a preset cutting line passes through the detection region and is located on a side of the detection contact pad close to the display function region. The detection region and the bonding region are located on different sides of the display function region, and arrangement of signal lines electrically connected with the detection region is not limited by the bonding region, so that a separation distance between signal lines of the detection region is increased as compared with that in a case where the detection region and the bonding region are located on a same side of the display function region, thus rendering a larger separation distance between signal lines. In this way, after the display substrate is obtained by using a cutting process, a probability of a short circuit between adjacent signal lines is reduced at a cutting line, which significantly reduces a risk of a short circuit due to a connection between adjacent signal lines, so that a yield of the display substrate is improved, and fabrication costs of the display substrate are reduced.

Hereinafter, a display substrate motherboard, a display substrate and a fabrication method thereof, and a display device according to at least one embodiment of the present disclosure will be described with reference to the accompanying drawings.

Figure 2A:
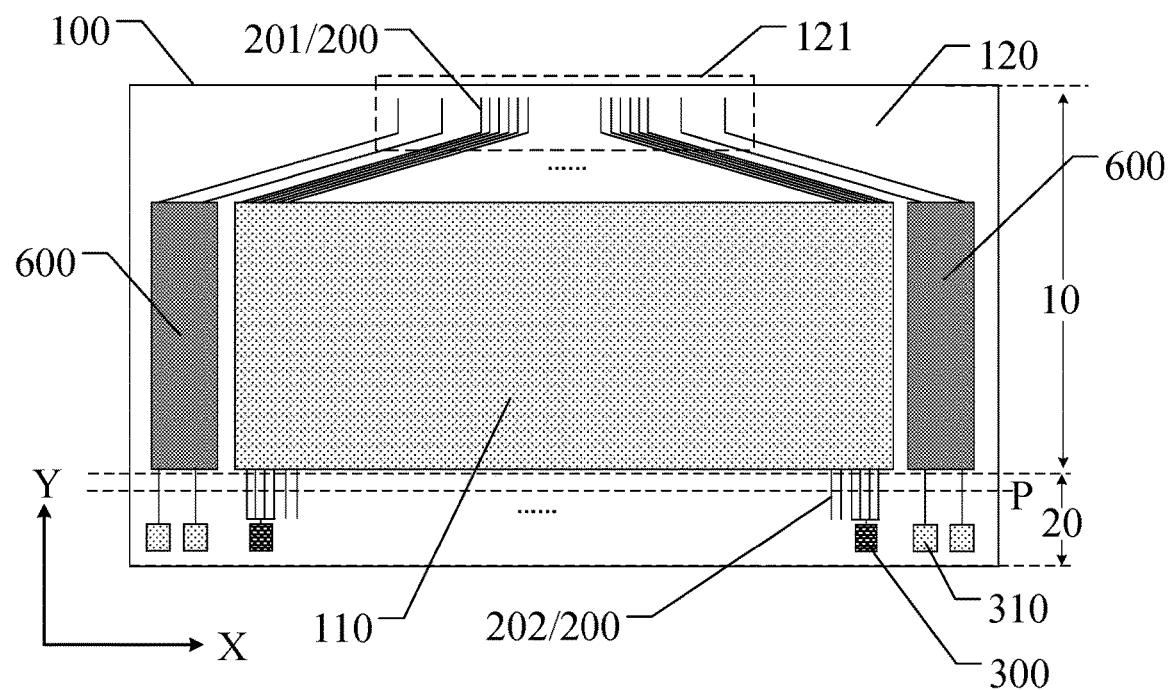
FIG. 2A is a planar structural schematic diagram of a display substrate motherboard provided by an embodiment of the present disclosure.
Figure 2B:
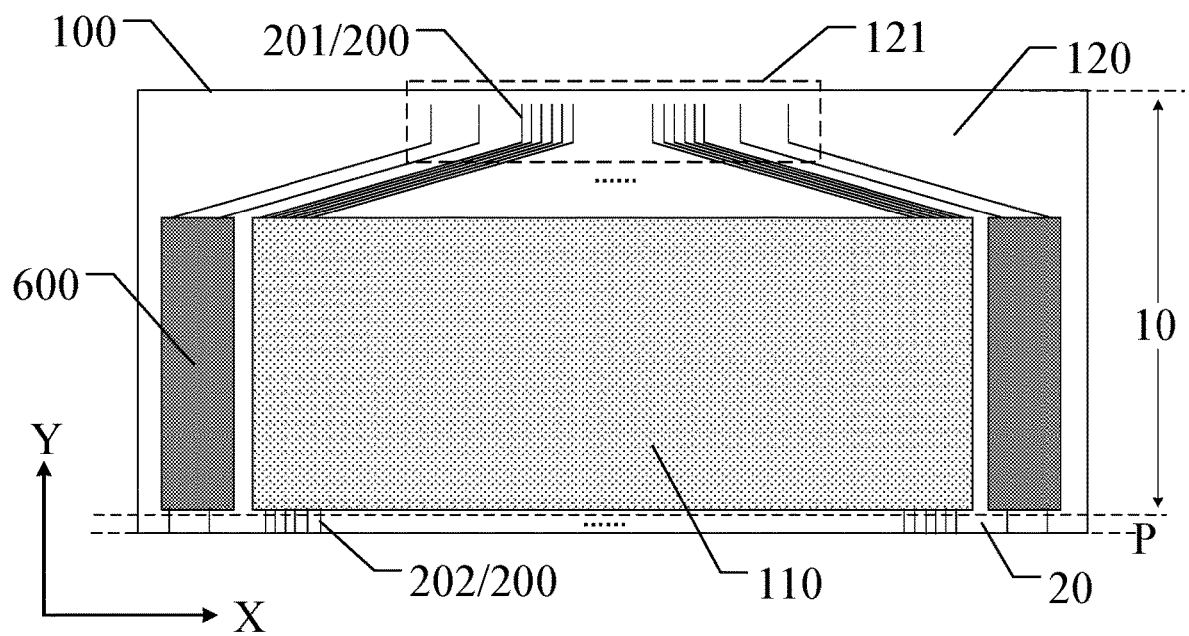
FIG. 2B is a planar structural schematic diagram of a display substrate obtained by cutting the display substrate motherboard shown in FIG. 2A along a cutting line P.

FIG. 2A is a planar structural schematic diagram of a display substrate motherboard provided by an embodiment of the present disclosure, and FIG. 2B is a planar structural schematic diagram of a display substrate obtained by cutting the display substrate motherboard shown in FIG. 2A along a cutting line P. It should be noted that the display substrate motherboard may comprise at least one display substrate unit (for example, a plurality of display substrate units); the display substrate unit is subjected to a cutting process to obtain a display substrate; and FIG. 2A only shows one display substrate unit of the display substrate motherboard.

For example, in at least one embodiment of the present disclosure, a display substrate motherboard comprises at least one display substrate unit, and as shown in FIG. 2A, the display substrate unit includes a display function region 10 and a detection region 20 located on one side of the display function region 10; the display function region 10 includes a display region 110 and a non-display region 120 surrounding the display region 110; the non-display region 120 includes a bonding region 121, and the detection region 20 is located on a side of the display region 110 different from the bonding region 121, for example, an opposite side of the bonding region 121.

For example, the detection region 20 is provided therein with a detection contact pad 300. In addition, the display function region further includes a plurality of signal lines 200 extending in parallel, and a first end 201 of the signal line 200 extends to the bonding region 121. For example, the signal line 200 extends obliquely toward a center of the display region 110 that is located at an adjacent side of the bonding region 121, in a region (a lead region) from the display region 110 to the bonding region 121. A second end 202 of the signal line 200 that is opposite to the first end 201 extends to the detection region 20 and is electrically connected with the detection contact pad 300; and a preset cutting line P passes through the detection region 20 and is located on a side of the detection contact pad 300 close to the display function region 10. In the display substrate motherboard, the detection region and the bonding region are located on different sides of the display region, and arrangement of signal lines electrically connected with the detection region is no longer limited by the bonding region, so that a separation distance between signal lines 200 is increased as compared with that in a case where the detection region 20 and the bonding region 121 are located on a same side of the display function region 10, thus rendering a larger separation distance between signal lines 200, that is, a separation distance between second ends 202 of adjacent signal lines 200 is larger than a separation distance between first ends 201 of adjacent signal lines 200.

As compared with a case where the detection contact pad 300 shown in FIG. 1A is limited by the bonding region 121, in the display substrate motherboard shown in FIG. 2A, the detection contact pad 300 electrically connected with the signal line 200 may be designed to have a larger size or there is a larger number of detection contact pads, which, thus, may improve accuracy of detection of the display substrate motherboard. For example, in the case where the detection contact pad 300 have a larger size, a probe for detection may have better contact with the detection contact pad 300; and in the case where a larger number of detection contact pads 300 are set, each detection contact pad 300 may be electrically connected with fewer signal lines 200, which may improve detection accuracy of a structure such as the signal line.

At least one embodiment of the present disclosure provides a display substrate, comprising a display region and a non-display region surrounding the display region, the non-display region including a bonding region, wherein, a signal line is provided on the display substrate, a first end of the signal line extends to the bonding region, and a second end of the signal line that is opposite to the first end extends to a detection region, for example, a cutting edge of the display substrate which is located at a detection region side. Exemplarily, as shown in FIG. 2A and FIG. 2B, the display substrate motherboard shown in FIG. 2A is cut, wherein, a display substrate unit is cut along a cutting line P to remove a detection contact pad 300, so as to obtain at least one display substrate shown in FIG. 2B. Exemplarily, as shown in FIG. 2B, the display substrate comprises a display region 110 and a non-display region 120 surrounding the display region 110; the non-display region 120 includes a bonding region 121; a first end 201 of a signal line 200 extends to the bonding region 121, a second end 202 of the signal line 200 that is opposite to the first end 201 extends to a detection region 20 of the display substrate, and the second end 202 extends to the cutting edge of the display substrate. The cutting edge corresponds to the cutting line P in the display substrate motherboard shown in FIG. 2A.

For example, in a display substrate provided by at least one embodiment of the present disclosure, a first end of a signal line does not extend to an edge of the display substrate. For example, further, the first end of the signal line does not extend to an edge of a side of a bonding region away from the display region. It should be noted that, arrangement of first ends of signal lines in a display substrate motherboard is the same as arrangement of signal lines in the display substrate. Exemplarily, as shown in FIG. 2B, first ends 201 of signal lines 200 do not extend to the edge of the display substrate, such that when the display substrate motherboard as shown in FIG. 2A is cut, the first ends 201 of the signal lines 200 are not cut, and first ends 201 of adjacent signal lines 200 do not come into contact with each other by cutting.

In at least one embodiment of the present disclosure, a connection mode of a signal line with a detection contact pad will not be limited. For example, in some embodiments of the present disclosure, as shown in FIG. 2A, a second end 202 of a signal line 200 may be in direct contact with a detection contact pad 300. For example, in other embodiments of the present disclosure, a connecting part may be provided between a second end 202 of a signal line 200 and a detection contact pad 300, and the connecting part is respectively connected with the second end 202 of the signal line 200 and the detection contact pad 300. For example, the connecting part may be a switching element, and in a turn-on state of the switching element, the second end 202 of the signal line 200 is electrically connected with the detection contact pad 300.

Figure 3A:
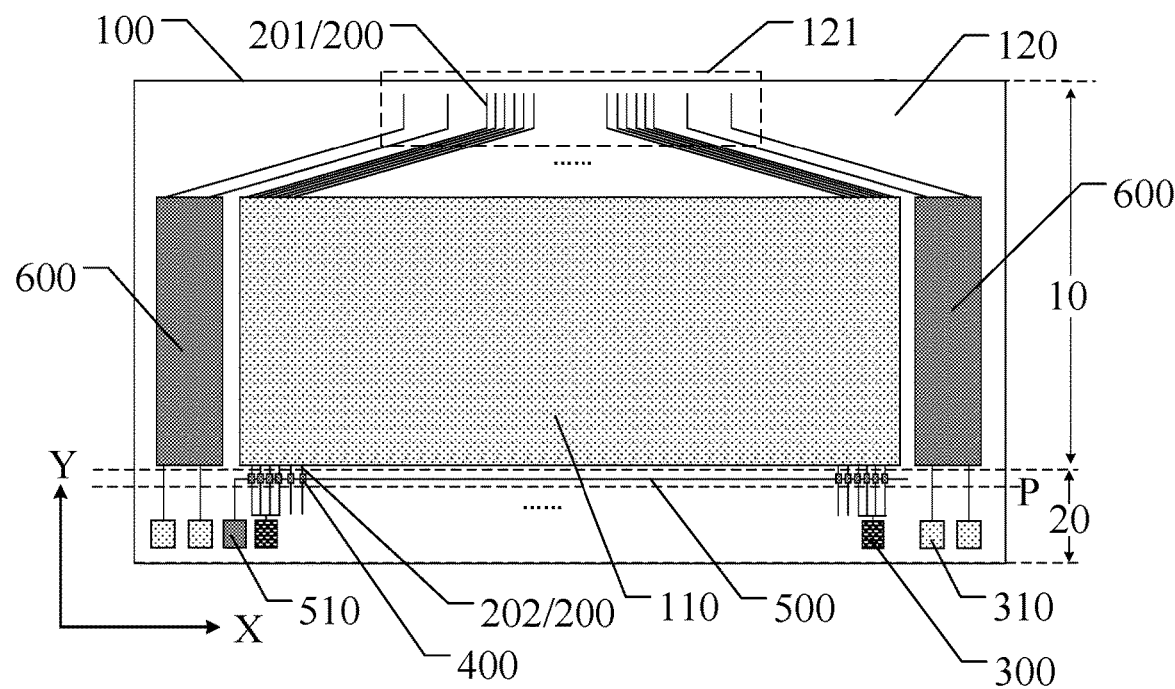
FIG. 3A is a planar structural schematic diagram of a display substrate motherboard provided by an embodiment of the present disclosure.
Figure 3B:
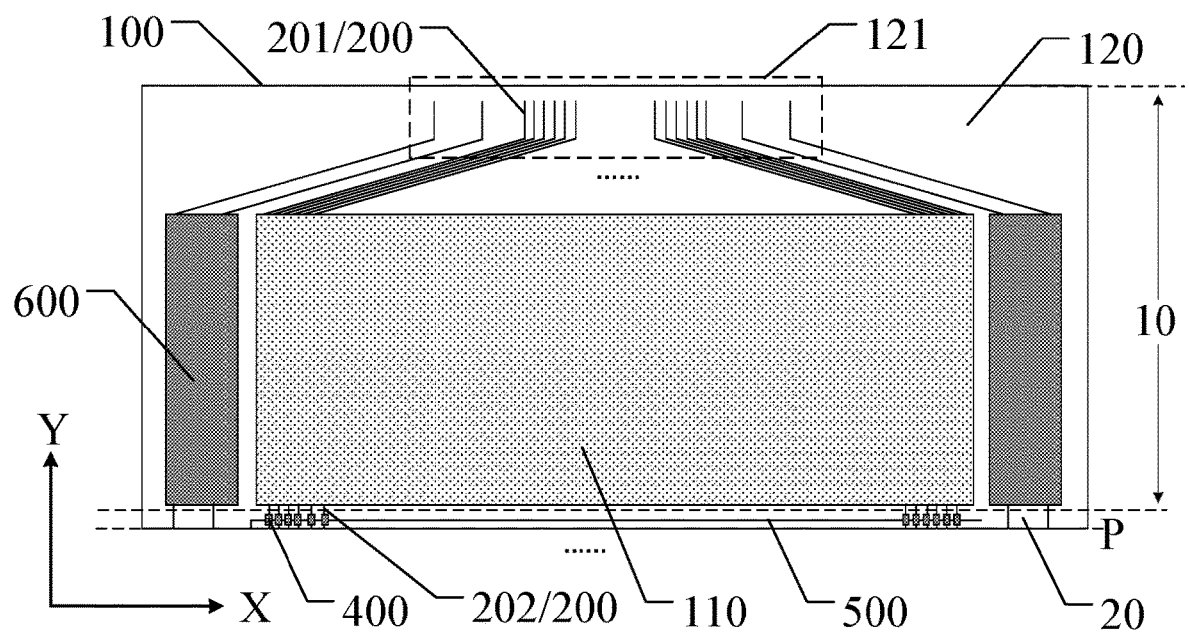
FIG. 3B is a planar structural schematic diagram of a display substrate obtained by cutting the display substrate motherboard shown in FIG. 3A along a cutting line P.
Figure 3C:
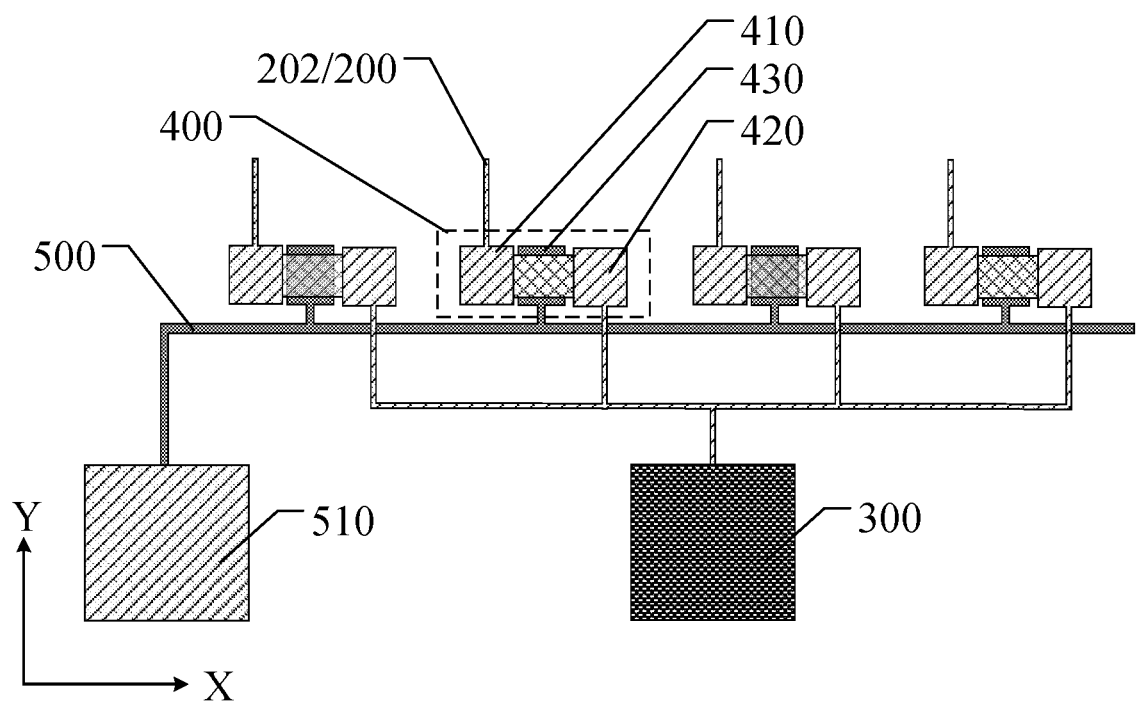
FIG. 3C is a partial structural schematic diagram of the display substrate motherboard shown in FIG. 3A.

FIG. 3A is a planar structural schematic diagram of a display substrate motherboard provided by an embodiment of the present disclosure, FIG. 3B is a planar structural schematic diagram of a display substrate obtained by cutting the display substrate motherboard shown in FIG. 3A along a cutting line P, and FIG. 3C is a partial structural schematic diagram of the display substrate motherboard shown in FIG. 3A.

For example, in at least one embodiment of the present disclosure, a display substrate motherboard may further comprise a switching element. The switching element is located in a detection region, a second end of a signal line is electrically connected with a first end of the switching element, and a second end of the switching element is electrically connected with a detection contact pad. For example, a preset cutting line is located between the second end of the switching element and the detection contact pad. Exemplarily, as shown in FIG. 3A and FIG. 3C, a plurality of switching elements 400 are provided in a detection region 20, a first end 410 of a switching element 400 is electrically connected with a second end 202 of a signal line 200, and a second end 420 of the switching element 400 is electrically connected with a detection contact pad 300. For example, a preset cutting line P is located between the second end 420 of the switching element 400 and the detection contact pad 300. For example, in a case where the switching element 400 is in a turn-on state, the first end 410 and the second end 420 of the switching element 400 are turned on (e.g., an electrical signal may be transmitted to each other); and in a case where the switching element 400 is in a turn-off state, the first end 410 and the second end 420 of the switching element 400 are turned off (e.g., an electrical signal cannot be transmitted to each other).

At least one embodiment of the present disclosure provides a display substrate, comprising a display function region and a detection region located on a side of the display function region, the display function region including a display region and a non-display region surrounding the display region, the non-display region including a bonding region, wherein, a signal line is provided on the display substrate, the detection region is located on a side of the display region that is opposite to the bonding region, a switching element is provided in the detection region, a first end of the signal line extends to the bonding region, a second end of the signal line that is opposite to the first end is electrically connected with a first end of the switching element, and a second end of the switching element extends to a cutting edge of the display substrate that is located on a side of the detection region. Exemplarily, as shown in FIG. 3B, the display substrate obtained by cutting the display substrate motherboard shown in FIG. 3A comprises a display function region 10 and a detection region (a region between the display function region 10 and a cutting line P) located on one side of the display function region, the display function region 10 includes a display region 110 and a non-display region 120 surrounding the display region 110, the non-display region 120 includes a bonding region 121, and the bonding region 121 is located on a side of the display region 110 that is opposite to the detection region, a signal line 200 is provided on the display substrate, a switching element 400 is located on a side of the display region 110 that is opposite to the bonding region 121 (the switching element 400 is located in the detection region), a first end 201 of the signal line 200 extends to the bonding region 121, a second end 202 of the signal line 200 that is opposite to the first end 201 is connected with a first end 410 of the switching element 400, and a second end 420 of the switching element 400 extends to a cutting edge of the display substrate. For example, the second end of the switching element is aligned with the cutting edge of the display substrate that is located on one side of the detection region. The cutting edge corresponds to the cutting line P in the display substrate motherboard shown in FIG. 3A.

As shown in FIG. 3A, FIG. 3B and FIG. 3C, the switching element 400 is located between a preset cutting line P and the display region 110. Thus, after the display substrate motherboard shown in FIG. 3A is cut, even if second ends 420 of adjacent switching elements 400 in the display substrate shown in FIG. 3B come into contact with each other by cutting, in a case where the switching element is in a turn-off state, second ends 202 of signal lines 200 will not be electrically connected with each other, so even if adjacent two signal lines 200 are short-circuited in a cut portion after cutting, a short circuit will not affect electrical signals loaded on the adjacent two signal lines in the display function region in a case where the switching element is in a turn-off state. Thus, after the switching element is provided in the detection region, a short-circuit problem of signal lines does not occur in the display substrate obtained by cutting the display substrate motherboard.

Hereinafter, with a case where a switching element respectively electrically connected with a signal line and a detection contact pad is provided in a detection region as an example, a display substrate motherboard, a display substrate and a fabrication method thereof, and a display device according to at least one embodiment of the present disclosure will be described.

For example, in a display substrate motherboard provided by at least one embodiment of the present disclosure, the display substrate motherboard comprises a plurality of signal lines, a plurality of switching elements, and the plurality of signal lines are connected with the plurality of switching elements in one-to-one correspondence. For example, the detection contact pads may be arranged to be connected with the switching elements (second ends of the switching elements) in one-to-one correspondence, or a detection contact pad may be arranged to be electrically connected with second ends of at least two switching elements.

Exemplarily, as shown in FIG. 3A, FIG. 3B and FIG. 3C, the signal lines 200 are connected with the switching elements 400 in one-to-one correspondence, and each detection contact pad 300 is electrically connected with a plurality of signal lines 200. As compared with the current display substrate motherboard, since a separation distance between second ends 202 of signal lines 200 is larger, the detection contact pad 300 is allowed to have a larger size (for example, a width in an X-axis direction), or each detection contact pad 300 may be connected with fewer signal lines 500, to improve accuracy of detection.

For example, a display substrate motherboard provided by at least one embodiment of the present disclosure further comprises a detection control line, the detection control line is located in a detection region, and the detection control line is electrically connected with a control end of a switching element, and is used for providing a control signal that controls ON or OFF of the switching element. Exemplarily, as shown in FIG. 3A, a detection control line 500 is provided in a detection region 20 of a display substrate motherboard, and the switching elements 400 located in the detection region 20 are all connected with the detection control line 500. In a process of detecting the display substrate motherboard, a control signal is input by the detection control line 500 to the switching element 400, to turn on the switching element, and thus, an electrical signal for detection may be input to a signal line 200 through a detection contact pad 300 and the switching element 400. After the display substrate motherboard is cut to obtain the display substrate as shown in FIG. 3B, there is no signal input in the detection control line 500, so the switching element 400 is in a turn-off state, in such case even if second ends 420 of adjacent switching elements 400 come into contact with each other by cutting, signal lines connected with the switching elements 400 are not short-circuited due to an electrical connection.

In at least one embodiment of the present disclosure, the number of detection control lines and correspondence relationship between the detection control lines and the switching elements will not be limited, and may be designed according to actual needs.

For example, in some embodiments of the present disclosure, as shown in FIG. 3A and FIG. 3B, the number of detection control lines 500 is set to one, and control ends of all switching elements 400 are electrically connected with the detection control line 500.

For example, in some embodiments of the present disclosure, the number of detection control lines 500 is set to be plural, the switching elements are divided into a plurality of groups, the group is in one-to-one correspondence with the detection control line, and a control end of each group of switching elements is electrically connected with a corresponding detection control line. For example, each group may include one or more switching elements, and the numbers of switching elements in respective groups may be equal or unequal to one another.

For example, a display substrate motherboard provided by at least one embodiment of the present disclosure further comprises a detection control contact pad, and the detection control contact pad is located in a detection region and is electrically connected with a detection control line. Exemplarily, as shown in FIG. 3A, a detection control contact pad 510 is located in a detection region 20, and the detection control contact pad 510 is connected with a detection control line 500. The detection control contact pad 510 has a size (e.g., a width along a side direction of a display function region where it is located) greater than a width of the detection control line 500, and may come into contact with a probe for detection. For example, as shown in FIG. 3A, the detection control contact pad 510 may be located on a side of a cutting line P away from a display region 110, such that the detection control contact pad 510 may be cut off in a process of cutting the display substrate motherboard.

In at least one embodiment of the present disclosure, types of a display substrate motherboard and a display substrate will not be limited. For example, the display substrate obtained by cutting the display substrate motherboard is an array substrate, a display region of the display substrate motherboard may include a plurality of gate lines and data lines, and the gate lines and the data lines intersect with each other to define a plurality of sub-pixel regions.

Hereinafter, in the absence of a clear description, a display substrate motherboard, a display substrate and a fabrication method thereof, and a display device according to at least one embodiment of the present disclosure will be described, with a case where the display substrate obtained by cutting the display substrate motherboard is an array substrate as an example.

In at least one embodiment of the present disclosure, a type of a switching element provided in a detection region will not be limited, as long as a first end and a second end of the switching element may be turned on or turned off. For example, the switching element may be a thin film transistor, and a detection control line is electrically connected with a gate electrode of the thin film transistor. Exemplarily, as shown in FIG. 3C, a switching element 400 in a detection region 20 is a thin film transistor, a first end 410 of the switching element 400 may be a source electrode of the thin film transistor, a second end 420 of the switching element 400 may be a drain electrode of the thin film transistor, and a control end 430 of the switching element 400 is a gate electrode of the thin film transistor. A detection control line 500 is electrically connected with the control end 430 (the gate electrode). For example, in a case where the display substrate obtained by cutting the display substrate motherboard is an array substrate, in a process of fabricating the thin film transistor in a display region 110, the switching element 400 may be synchronously fabricated in the detection region 20. Thus, as compared with the current display substrate motherboard or display substrate, fabrication of the switching element in the detection region 20 does not require an additional fabrication process.

For example, in at least one embodiment of the present disclosure, in a case where a switching element located in a detection region is a thin film transistor, a type of the thin film transistor will not be limited. For example, the switching element may be a thin film transistor of a top gate type, a bottom gate type, a double gate type, and other type.

For example, a detection control line may be provided in a same layer and may be made of a same material as a gate line in a display region. Thus, in a process of fabricating the gate line in the display region, the detection control line may be formed synchronously, and as compared with the current display substrate motherboard or display substrate, setting of the detection control line does not require an additional fabrication process.

In at least one embodiment of the present disclosure, a type of the above-described signal line will not be limited. For example, in a display substrate motherboard provided by at least one embodiment of the present disclosure, in a case where a display substrate obtained by cutting the display substrate motherboard is an array substrate, the signal line according to the above-described embodiments may include a data line.

For example, in at least one embodiment of the present disclosure, a gate drive circuit may be provided in a non-display region of a display substrate motherboard, and the gate drive circuit is used for inputting a control signal to a gate line in a display region. For example, the gate drive circuit may be a Gate Driven on Array (GOA) circuit, which may reduce a size of the gate drive circuit and increase a proportion of an area occupied by the display region in the display substrate, which is favorable for designing an extremely narrow frame of the display substrate (or a display device comprising the display substrate). The GOA circuit may be provided on one side of the display region (single side drive), or may also be provided on two opposite sides of the display region (double-side drive).

Exemplarily, as shown in FIG. 3A and FIG. 3B, the gate drive circuit is a GOA circuit, and the gate drive circuit 600 includes a frame start scan line, a clock signal line, a reset line, and other wires; and the wire may have one end extend to a bonding region 121, and the other end extend into a detection region 20. For example, a gate drive control contact pad 310 connected with the wire in the gate drive circuit 600 may be provided in the detection region, and is used for providing a control signal such as a clock signal required by the gate drive circuit in a detection process.

For example, in some embodiments of the present disclosure, as shown in FIG. 3A, in a case where a detection control line 500 and a switching element 400 are provided in a detection region 20, it is not necessary to provide the switching element 400 on a wire in a gate drive circuit 600, and the wire in the gate drive circuit 600 may be directly connected with a detection contact pad. A separation distance between wires in the gate drive circuit 600 is usually larger, and when a display substrate motherboard is cut, a risk that adjacent wires in the gate drive circuit 600 are connected with each other by cutting is lower. For example, with respect to a gate drive control contact pad 310 connected with the gate drive circuit 600, the gate drive control contact pad 310 may be arranged to be connected with wires of the gate drive circuit 600 in one-to-one correspondence.

Figure 4A:
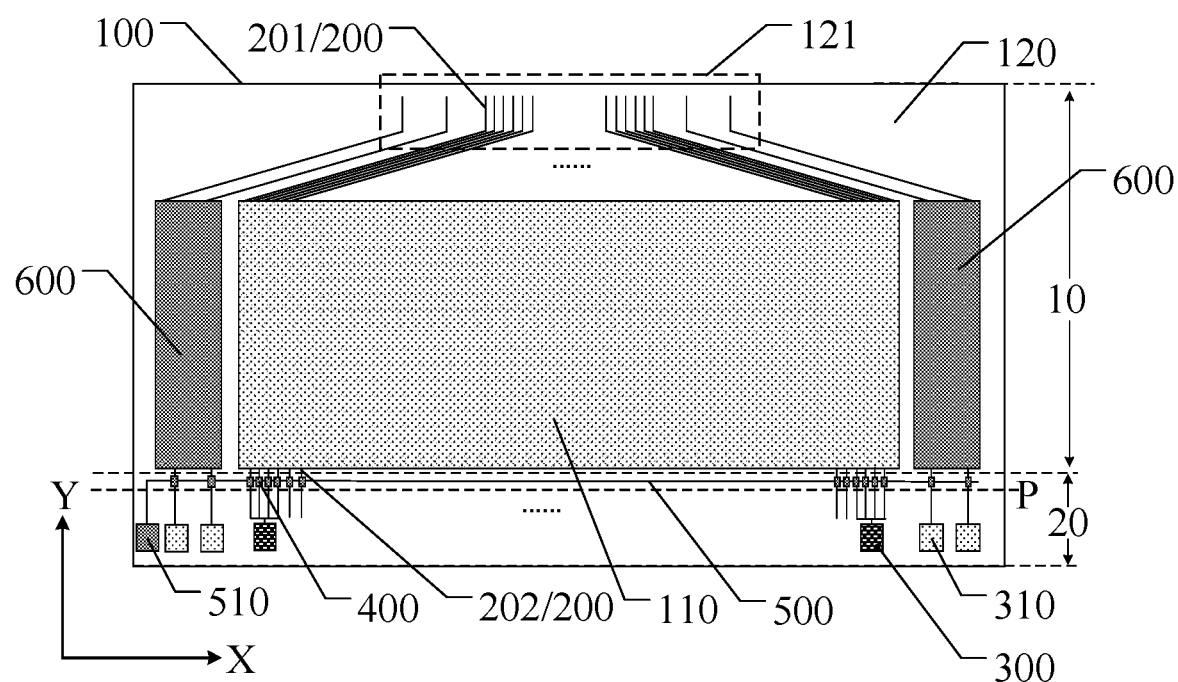
FIG. 4A is a planar structural schematic diagram of another display substrate motherboard provided by an embodiment of the present disclosure.
Figure 4B:
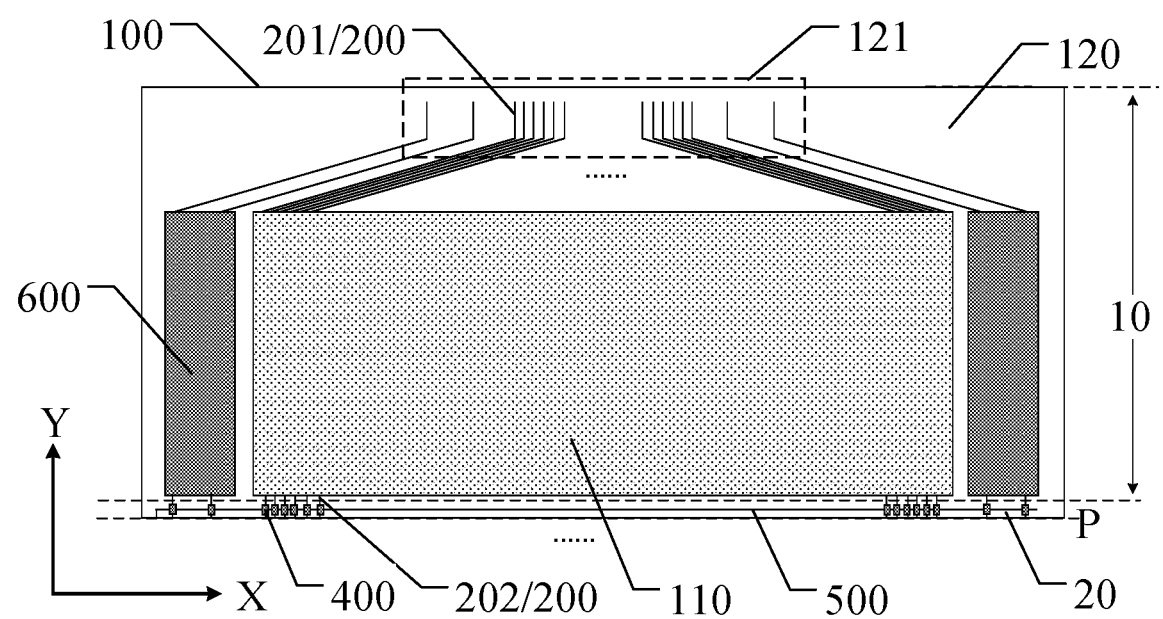
FIG. 4B is a planar structural schematic diagram of a display substrate obtained by cutting the display substrate motherboard shown in FIG. 4A along a cutting line P.

FIG. 4A is a planar structural schematic diagram of another display substrate motherboard provided by an embodiment of the present disclosure, and FIG. 4B is a planar structural schematic diagram of a display substrate obtained by cutting the display substrate motherboard shown in FIG. 4A along a cutting line P.

For example, in other embodiments of the present disclosure, in a case where a detection control line and a switching element are provided in a detection region, a switching element is provided between a wire in a gate drive circuit and a detection contact pad, the wire in the gate drive circuit is connected with the detection contact pad through the switching element, and the detection control line controls turn-on and turn-off of the switching element. Exemplarily, a signal line may include the wire of the gate drive circuit. As shown in FIG. 4A, a switching element 400 is provided at one end of the wire of the gate drive circuit 600 extending toward a detection region 20; with respect the switching element 400 in the region, the switching element 400 has one end connected with the wire of the gate drive circuit 600, and the other end electrically connected with a gate drive control contact pad 310 in the detection region 20; and the detection control line 500 controls ON or OFF of the switching element 400 connected with the wire of the gate drive circuit 600. Thus, in a process of cutting the display substrate motherboard shown in FIG. 4A to obtain the display substrate shown in FIG. 4B, even if ends of switching elements 400 that are connected with wires of the gate drive circuit 600 come into contact with each other by cutting, a short circuit does not occur between the wires of the gate drive circuit 600. For example, related description in the foregoing embodiments (for example, the embodiments shown in FIG. 3A and FIG. 3B) may be referred to for a structure of the switching element 400 connected with the wire of the gate drive circuit 600, which will not be repeated here.

It should be noted that, in at least one embodiment of the present disclosure, after detection is completed, the display substrate motherboard may also be formed into a display panel motherboard by using a process such as cell-assembling or encapsulation; a plurality of display panel daughter boards may be obtained by cutting the display panel motherboard; and each display panel daughter board includes the display substrate according to the foregoing embodiments.

At least one embodiment of the present disclosure provides a display device, comprising the display substrate according to any one of the above-described embodiments. For example, the display device comprises a display panel, the display panel including the display substrate according to any one of the above-described embodiments. In at least one embodiment of the present disclosure, a type of a display device will not be limited.

For example, in at least one embodiment of the present disclosure, the display device may be a liquid crystal display device, the display substrate is an array substrate; the display device may further comprise a color filter substrate cell-assembled with the array substrate, the two are provided opposite to each other to form a liquid crystal cell; and a liquid crystal material is filled in the liquid crystal cell. A pixel electrode and a common electrode of each pixel unit of the array substrate are used for applying an electric field to control a rotation degree of the liquid crystal material, so as to perform a display operation.

For example, in at least one embodiment of the present disclosure, the display device may be an Organic Light-Emitting Diode (OLED) display device, the display substrate is an array substrate, the array substrate includes a plurality of sub-pixel regions; a lamination of an organic light-emitting material may be formed in each sub-pixel, and a pixel electrode in each sub-pixel region may serve as an anode or a cathode for driving the organic light-emitting material to emit light, so as to perform a display operation.

For example, in at least one embodiment of the present disclosure, the display device may be an electronic paper display device, the display substrate is an array substrate, an electronic ink layer may be further formed on the array substrate, and a pixel electrode of each pixel unit is used for applying a voltage that drives charged microparticles in electronic ink to move, so as to perform a display operation.

For example, in at least one embodiment of the present disclosure, the display device may be a television, a digital photo frame, a mobile phone, a watch, a tablet personal computer, a laptop, a navigator, and any other product or component having a display function.

At least one embodiment of the present disclosure provides a fabrication method of a display substrate, comprising: providing a base substrate, the base substrate including a plurality of display substrate unit regions, the display substrate unit region including a detection region, a display region and a bonding region, the bonding region being located on a side of the display region different from the detection region; and cutting the base substrate along a preset cutting line passing through the detection region, to obtain the display substrate.

For example, the display substrate unit region includes a display function region and the detection region located on a side of the display function region, the display function region includes a display region and a non-display region surrounding the display region, the non-display region includes a bonding region, and the bonding region is located on a side of the display region that is opposite to the detection region; and the method further comprises: forming a detection contact pad in the detection region, and forming a signal line on the display function region, wherein, a first end of the signal line extends to the bonding region, and a second end of the signal line that is opposite to the first end is electrically connected with the detection contact pad. The cutting the base substrate along a preset cutting line passing through the detection region includes: cutting the base substrate along the preset cutting line passing through the detection region and located on a side of the detection contact pad close to the display function region. In the fabrication process of the display substrate, the detection region and the bonding region are located on different sides of the display region, and arrangement of signal lines electrically connected with the detection region is not limited by the bonding region, so that a separation distance between signal lines of the detection region is increased as compared with that in a case where the detection region and the bonding region are located on a same side of the display function region, rendering a larger separation distance between signal lines in the detection region. In this way, after the display substrate is obtained by using a cutting process, a probability of a short circuit between adjacent signal lines is reduced at a cutting line, which significantly reduces a risk of a short circuit due to a connection between adjacent signal lines, so that a yield of the display substrate is improved, and fabrication costs of the display substrate are reduced.

For example, a fabrication method of a display substrate provided by at least one embodiment of the present disclosure further comprises: forming a switching element in a detection region, wherein, a second end of a signal line is electrically connected with a first end of the switching element, and a second end of the switching element is electrically connected with a detection contact pad. In the display substrate obtained by using the above-described fabrication method, after a cutting process is performed, even if second ends of adjacent switching elements in the display substrate come into contact with each other by cutting, in a case where the switching element is in a turn-off state, second ends of signal lines are not electrically connected with each other. Thus, after the switching element is formed in the detection region, a short-circuit problem of signal lines does not occur in the display substrate obtained by cutting the display substrate motherboard.

For example, a fabrication method of a display substrate provided by at least one embodiment of the present disclosure further comprises: forming a detection control line in a detection region, wherein, the detection control line is formed to be electrically connected with a switching element to control ON or OFF of the switching element, that is, control an electrical connection or disconnection of a first end and a second end of the switching element. In the display substrate obtained by using the above-described fabrication method, after a cutting process is performed, there is no signal input in the detection control line, so the switching element is in a turn-off state, in such case even if second ends of adjacent switching elements come into contact with each other by cutting, signal lines connected with the switching elements are not short-circuited due to an electrical connection.

For example, a fabrication method of a display substrate provided by at least one embodiment of the present disclosure further comprises: forming a detection control contact pad in a detection region, wherein, the detection control contact pad is electrically connected with a detection control line. In the display substrate obtained by using the above-described fabrication method, the detection control contact pad may have a size (e.g., a width) larger than a width of the detection control line, and may come into contact with a probe for detection.

It should be noted that, related description in the foregoing embodiments may be referred to for a structure of the display substrate motherboard and the display substrate obtained by using the above-described fabrication method, which will not be repeated here.

At least one embodiment of the present disclosure provides a display substrate motherboard, a display substrate and a fabrication method thereof, and a display device, and may have at least one advantageous effect below:

(1) In a display substrate motherboard and a display substrate provided by at least one embodiment of the present disclosure, arrangement of signal lines electrically connected with a detection region is not limited by a bonding region, so that a separation distance between signal lines is increased; after the display substrate is obtained by using a cutting process, it is difficult for adjacent signal lines to be connected with each other at a cutting line, which significantly reduces a risk of a short circuit due to a connection between adjacent signal lines, so as to improve a yield of the display substrate.

(2) In a display substrate motherboard and a display substrate provided by at least one embodiment of the present disclosure, a separation distance between signal lines electrically connected with a detection region is increased, so that a detection contact pad electrically connected with the signal line may be designed to have a larger size or there is a larger number of detection contact pads, which may improve accuracy of detection of the display substrate motherboard.

(3) In a display substrate motherboard and a display substrate provided by at least one embodiment of the present disclosure, in a case where a switching element connected with a detection contact pad and a signal line is formed in a detection region, even if second ends of adjacent switching elements in the display substrate come into contact with each other by cutting, a short-circuit problem of signal lines does not occur in the display substrate obtained by cutting the display substrate motherboard.

The following statements should be noted:

(1) Unless otherwise defined, the same reference number is denoted as the same meaning in the embodiments of the accompanying drawings of the present disclosure.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.

(4) In case of no conflict, features in one embodiment or in different embodiments can be combined to obtain a new embodiment.

In case of no conflict, embodiments of the present disclosure or features in one embodiment or in different embodiments can be combined.

What are described above is related to the specific embodiments of the disclosure only and not limitative to the scope of the disclosure. The protection scope of the disclosure shall be based on the protection scope of the claims.

The application claims priority to the Chinese patent application No. 201811004709.3, filed Aug. 30, 2018, the disclosure of which is incorporated herein by reference as part of the application.

The invention claimed is:

1. A display substrate motherboard, comprising at least one display substrate unit, the display substrate unit including:
 a display region;
 a bonding region, located on a side of the display region; and
 a detection region, located on a side of the display region that is opposite to the bonding region, and configured to detect the display substrate unit.

2. The display substrate motherboard according to claim 1, wherein, the display substrate unit includes a display function region, the display function region includes a display region and a bonding region, the detection region is located on a side of the display function region, and the display function region includes a signal line,
 a first end of the signal line extends to the bonding region, and a second end of the signal line that is opposite to the first end extends to the detection region.

3. The display substrate motherboard according to claim 2, further comprising:
 a detection contact pad, provided in the detection region and configured to be electrically connected with a detecting device during detection,
 wherein, the second end is electrically connected with the detection contact pad.

4. The display substrate motherboard according to claim 3, further comprising:
 a switching element, located in the detection region;
 wherein, the signal line is connected with the switching element in one-to-one correspondence, the second end of the signal line is electrically connected with a first end of the switching element, and a second end of the switching element is electrically connected with the detection contact pad.

5. The display substrate motherboard according to claim 4, further comprising:
 a detection control line, located in the detection region;
 wherein, the detection control line is electrically connected with a control end of the switching element, and is configured to provide a control signal that controls turn-on or turn-off of the switching element.

6. The display substrate motherboard according to claim 5, wherein,
   a number of detection control lines is set to one, and control ends of all the switching elements are electrically connected with the detection control line; or
   the number of detection control lines is set to be plural, the switching elements are divided into a plurality of groups, the plurality of groups are in one-to-one correspondence with the detection control lines, and a control end of each group of the switching elements is electrically connected with a corresponding one of the detection control lines.

7. The display substrate motherboard according to claim 5, wherein, the switching element is a thin film transistor, and the detection control line is electrically connected with a gate electrode of the thin film transistor.

8. The display substrate motherboard according to claim 4, wherein, the display substrate unit further includes a preset cutting line, the switching element is located between the preset cutting line and the display region, and the detection contact pad is located on a side of the preset cutting line that is opposite to the display region.

9. The display substrate motherboard according to claim 4, wherein, the detection contact pad is electrically connected with second ends of at least two of the switching elements.

10. A display substrate, comprising:
   a display region;
   a bonding region, located on a side of the display region; and
   a detection region, located on a side of the display region that is opposite to the bonding region, and configured to detect the display substrate unit.

11. The display substrate according to claim 10, wherein, the display substrate comprises a display function region, the display function region includes the display region and the bonding region, the detection region is located on a side of the display function region, and the display function region includes a signal line,
   a first end of the signal line extends to the bonding region, and a second end of the signal line that is opposite to the first end extends to the detection region.

12. The display substrate according to claim 11, further comprising:
   a switching element, provided in the detection region,
   wherein, the second end of the signal line that is opposite to the first end is electrically connected with a first end of the switching element, and a second end of the switching element extends to a cutting edge of the display substrate that is located on a side of the detection region.

13. The display substrate according to claim 12, wherein, the second end of the switching element is aligned with the cutting edge of the display substrate that is located on a side of the detection region.

14. A display device, comprising the display substrate according to claim 10.

15. A fabrication method of a display substrate, comprising:
   providing a base substrate, the base substrate including a plurality of display substrate unit regions, the display substrate unit region including a detection region, a display region and a bonding region, the bonding region being located on a side of the display realm that is opposite to the detection region; and
   cutting the base substrate along a preset cutting line passing through the detection region, to obtain the display substrate.

16. The fabrication method of the display substrate according to claim 15, wherein, the display substrate unit region includes a display function region, and the detection region is located on a side of the display function region,
   the fabrication method further comprises:
   forming a detection contact pad in the detection region, and
   forming a signal line on the display function region, a first end of the signal line extending to the bonding region, and a second end of the signal line that is opposite to the first end being electrically connected with the detection contact pad;
   the cutting the base substrate along the preset cutting line passing through the detection region includes:
   cutting the base substrate along the preset cutting line passing through the detection region and located on a side of the detection contact pad close to the display function region.

17. The fabrication method according to claim 16, further comprising:
   forming a switching element in the detection region;
   wherein, the second end of the signal line is electrically connected with a first end of the switching element, a second end of the switching element is electrically connected with the detection contact pad, and the preset cutting line is located between the second end of the switching element and the detection contact pad.

18. The fabrication method according to claim 17, further comprising:
   forming a detection control line in the detection region;
   wherein, the detection control line is formed to be electrically connected with the switching element, and is configured to control turn-on and turn-off of the switching element.

* * * * *